April 22, 1958 H. JANKOWSKI 2,831,969
AUTOMATIC GAIN CONTROL RATIO CIRCUIT
Filed Aug. 5, 1957
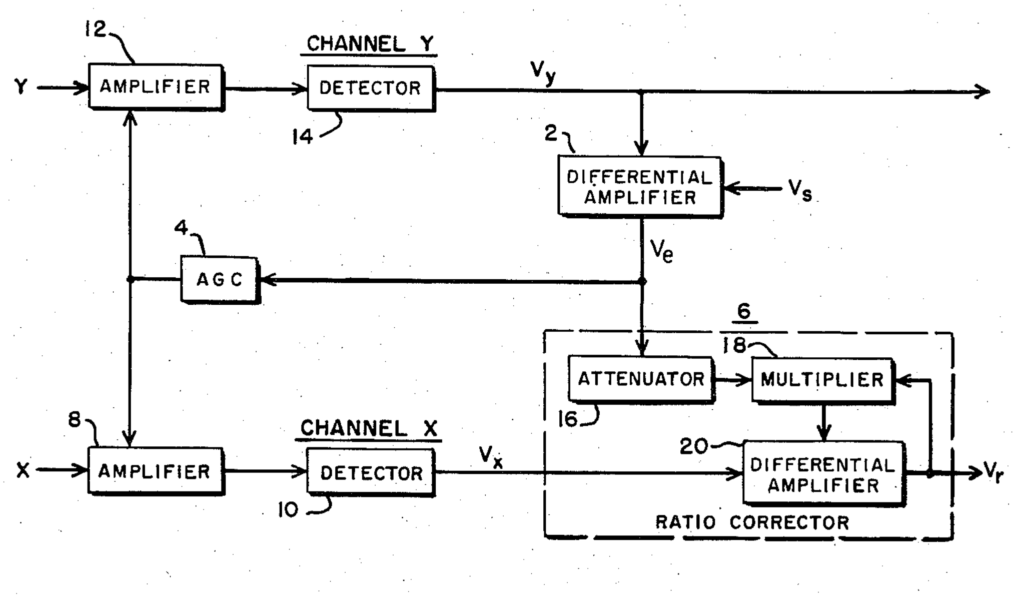
INVENTOR,
HERMAN JANKOWSKI.
BY Frederick M. Strader
ATTORNEY.

2,831,969

AUTOMATIC GAIN CONTROL RATIO CIRCUIT

Herman Jankowski, Ithaca, N. Y., assignor to the United States of America as represented by the Secretary of the Army Application August 5, 1957, Serial No. 676,453

5 Claims. (Cl. 250—20)

This invention relates to electrical ratio determining devices and particularly to an automatic gain control ratio circuit which provides for instantaneous ratio correction.

It is well known that where two voltages are fed through separate variable amplification channels that the output of one of these channels, which we will refer to as channels, which we will refer to as channel X, may be made to vary as a function of the ratio of the input voltages and the output of the other channel, which we will refer to as channel Y, will be held approximately at a reference output level by applying to both variable gain channels an automatic gain control signal which is proportional to the difference between a reference signal and the out of channel Y. A difference signal may be conveniently obtained as the output of a differential amplifier to which the reference signal and the output of channel Y are fed.

It has been observed that the accuracy of the ratio indicated by the foregoing method varies inversely with the time constant of the automatic gain control and the frequency of the signal applied to channel Y, which channel is within the automatic gain control loop. This occurs because the automatic gain control voltage which must vary the gain of the ratio forming channel, channel X, in accordance with the term of the ratio fed to channel Y, becomes less responsive as either of the aforesaid factors is increased.

It is an object of the present invention to improve the accuracy of automatic gain control type ratio circuits.

It is a further object of the invention to accomplish the improvement in accuracy without disturbing the normal function of automatic gain control to allow unimpeded the passage of amplitude variations of the desired intelligence signal through the channel which in our above illustration would correspond to channel Y.

In accordance with the invention a compensating effect is applied to the output of channel X, the ratio voltage, which will correct for the error produced by the particular automatic gain control time constant employed. As a result there will be provided a ratio voltage which will continuously and substantially instantaneously vary proportionally with the ratio of the voltages applied to the respective channels. In one form of the invention the compensating effect is derived from the voltage output of the differential amplifier described above which drives the automatic gain control; and in one embodiment of this form of the invention the differential output voltage is used to control the amount and sign of the output of channel X used in a feedback fashion to correct the output of this channel to conform to the true ratio.

The features of my invention which are believed to be novel are set forth with particularity in the appended claims. The invention itself, however, both as to its organization and method of operation, together with further objects and advantages thereof, may best be understood by reference to the following description taken in conjunction with the accompanying drawing which shows a block diagram of one embodiment of the invention.

Referring to the drawing there is shown an automatic gain control ratio circuit comprising two signal transmission channels, a first differential amplifier 2, an A. G. C. (automatic gain control) 4, and a ratio corrector circuit 6.

The channels are designated X and Y in accordance with the preceding discussion and as an example might be used in a simultaneous lobing system of the general type disclosed in the patent to Phillips, 2,682,656. In such a system the ratio of the sum and difference channels might be utilized in the computation of the antenna directional error.

Channel X consists of I. F. (intermediate frequency) amplifier 8, detector 10, and channel Y consists of I. F. amplifier 12 and detector 14. In each channel the output of the I. F. amplifier is connected to the input of the detector. An output of detector 14 is connected to one input of differential amplifier 2 and a reference voltage is applied to a second input of differential amplifier 2. The output of the differential amplifier is connected to the input of A. G. C. 4 and the output of the A. G. C. is connected to a bias input of both I. F. amplifiers to provide equal biasing.

The ratio corrector circuit 6 consists of attenuator 16, multiplier 18, and differential amplifier 20. The input of attenuator 16 is connected to the output of differential amplifier 2. One input of multiplier 18 is connected to the output of attenuator 16 and another input of the multiplier is connected to the output of differential amplifier 20. The output of multiplier 18 is connected to one input of differential amplifier 20 and the output of detector 10 is connected to another input of differential amplifier 20.

To illustrate the operation of the circuit, let us assume that an X voltage is applied to the input of X-channel I. F. amplifier 8, a Y voltage is applied to the input of Y-channel I. F. amplifier 12, and a reference voltage $V_s$ is applied to the reference voltage input to differential amplifier 2. Provided that the voltage variation in the input voltage Y is sufficiently slow for the A. G. C. loop to follow, the output voltage from detector 14, which we will term $V_y$, will equal the reference voltage $V_s$; therefore, the output voltage from differential amplifier 2, which is the A. G. C. loop error voltage and which we will term $V_e$, will be zero. It will be observed that the automatic gain control loop comprises I. F. amplifier 12, differential amplifier 2 and A. G. C. 4.

With no A. G. C. loop error the output voltage of channel X detector 10, which voltage we will term $V_x$, will equal the true ratio output voltage which we will term $V_r$. $V_r$ may be expressed as $V_r = V_s y/x$. No correction is required of the ratio corrector to obtain $V_r$ and it produced none since the corrector input voltage which is obtained from the output of differential amplifier 2 is zero.

Next, assume that the Y-channel input voltage varies too rapidly for the A. G. C. loop to follow. Then the Y-channel output voltage $V_y$ will not equal the reference voltage $V_s$, and their difference voltage, which is the error voltage $V_e$ appearing at the output of differential amplifier 2 will assume a value other than zero. In such case, $V_e$ will energize the corrector circuit. $V_e$ is fed through attenuator 16 to multiplier 18 where it is multiplied by the output ratio voltage $V_r$. The product is subtracted in differential amplifier 20 from the X-channel detector output voltage $V_x$ to obtain a corrected ratio output voltage $V_r$. The correction function of the ratio corrector may be expressed as follows:

$$V_r = V_x - KV_eV_r \tag{1}$$

where K is a constant associated with the multiplier 18 and attenuator 16.

Since $V_e=V_y-V_s$ the equation may be rewritten as:

$$V_r=V_x-KV_r(V_y-V_s) \tag{2}$$

or $$V_r=\frac{V_x}{1+KV_y-KV_s} \tag{3}$$

Then provided the X and Y channels have the same gain at all times:

$$V_y=uy,\ V_x=uX$$

and $$V_y=\frac{Y}{X}V_x$$

Substituting for $V_y$ in Equation 3:

$$V_r=\frac{V_x}{1-KV_s+K\frac{Y}{X}V_x} \tag{4}$$

It is apparent from inspection that if $$K=\frac{1}{V_s}$$

that the desired correction will have been obtained since then $$V_r=\frac{X}{Y}V_s$$

To illustrate the advantages of the corrector we will assume that the output of channel Y suddenly rises to a value equal to $2V_s$. The initial resulting error in the ratio would be 100%. However, with the ratio corrector in the circuit the error can be reduced to a small fraction of this figure and without the employment of an accurate multiplier. As an example, with a multiplier allowing an error of 10% in K, the error in the corrected ratio output would be reduced to 5%.

While there have been described what are at present considered preferred embodiments of the invention, it will be obvious to those skilled in the art that various changes and modifications may be made therein without departing from the invention; and it is aimed in the appended claims to cover all such changes and modifications as fall within the true spirit and scope of the invention.

What is claimed is:

1. A radio transmission system comprising first and second transmission channels, each comprising a radio frequency variable gain amplifier and a modulation detector, the output of said first channel amplifier being connected to the input of said first channel detector and the output of said second channel amplifier being connected to the input of said second channel detector, an automatic gain control having a predetermined time constant, a difference producing circuit, a first input of said difference producing circuit being connected to the output of said first channel detector, a second input of said difference producing circuit being connected to a source of reference voltage, the output of said difference producing circuit being connected to the input of said automatic gain control, the output of said automatic gain control being connected to both said variable gain amplifiers to vary the gain of said amplifiers equally, and a means for compensating for the effects of said time constant whereby the output of said second channel detector will continuously and substantially instantaneously vary proportionally with the ratio of signals applied to the inputs of said variable gain amplifiers.

2. A system as set forth in claim 1, wherein said means comprises means responsive to the output of said difference producing circuit and the output of said second channel detector.

3. A system as set forth in claim 1, wherein said means comprises means responsive to the output of said difference producing circuit and the output of said second channel detector for varying the output of said second channel detector in accordance with the output of said difference producing circuit.

4. A system as set forth in claim 3, wherein said second named means comprises an attenuator, multiplier, and a second difference producing circuit, the input of said attenuator being connected to the output of said first named difference producing circuit and the output of said attenuator being connected to a first input of said multiplier, a first input of said second difference producing circuit being connected to the output of said second channel detector, a second input of said second difference producing circuit being connected to the output of said multiplier and the output of said second difference producing circuit being connected to a second input of said multiplier.

5. A system as set forth in claim 4, wherein said multiplier has a constant characteristic corresponding to the reciprocal of the reference voltage connected to said second input of said difference producing circuit.

References Cited in the file of this patent

UNITED STATES PATENTS

| | | |
|---|---|---|
| 2,026,254 | Hoovens | Dec. 31, 1935 |
| 2,279,031 | Cockerell | Apr. 7, 1942 |
| 2,504,341 | Matthews | Apr. 18, 1950 |